United States Patent
Kimura et al.

Patent Number: 6,033,490
Date of Patent: Mar. 7, 2000

[54] GROWTH OF GAN LAYERS ON QUARTZ SUBSTRATES

[75] Inventors: Akitaka Kimura; Chiaki Sasaoka; Koichi Izumi, all of Tokyo, Japan

[73] Assignee: NEC Corporation, Tokyo, Japan

[21] Appl. No.: 09/145,465

[22] Filed: Sep. 2, 1998

[30] Foreign Application Priority Data

Sep. 2, 1997 [JP] Japan ................................ 9-237167

[51] Int. Cl.$^7$ ................................................. H01L 21/20
[52] U.S. Cl. ...................... 148/33.4; 148/33.5; 117/952; 438/46; 438/507; 438/967
[58] Field of Search ................................ 438/46, 503, 504, 438/507, 967; 117/952; 148/33, 33.4, 33.5

[56] References Cited

FOREIGN PATENT DOCUMENTS 8-83928  3/1996  Japan .

OTHER PUBLICATIONS

Zhou et al., "Growth of GaN films by combined laser and microwave plasma enhanced chemical vapor deposition", Journal of Crystal Growth, vol. 151, pp. 249–253, Jun. 1995.
Naniwae, et al., "Growth of Single Crystal GaN Substrate Using Hydride Vapor Phase Epitaxy" Journal of Crystal Growth 99 (1990) pp. 381–384.
Gotz, et al., "Electronic and Structural Properties of GaN Grown by Hydride Vapor Phase Epitaxy", Appl. Phys. Lett. 69 (2), Jul. 8, 1996, pp. 242–244.

*Primary Examiner*—Chandra Chaudhari
*Assistant Examiner*—Keith Christianson
*Attorney, Agent, or Firm*—McGinn & Gibb, P.C.

[57] ABSTRACT

In a method of manufacturing a semiconductor device which includes a quartz substrate having a z-cut plane of (0001) plane on a surface, a GaN film is first deposited on the surface. Finally, the quartz substrate is removed from the GaN film. The removed GaN film is used as a real substrate for forming GaN based compound semiconductor layers thereon.

25 Claims, 2 Drawing Sheets

GROWTH OF GAN LAYERS ON QUARTZ SUBSTRATES

BACKGROUND OF THE INVENTION

This invention relates to a method of manufacturing a semiconductor device having a gallium nitride (GaN) film.

A gallium nitride (thereinafter, abbreviated as a GaN) semiconductor device generally has a large forbidden band energy as compared to the conventional compound semiconductor device, such as, indium phosphide (InP) and gallium arsenide (GaAs) semiconductor devices.

Therefore, a GaN based compound semiconductor which is specified by a general formula $(In_xAl_yGa_{1-x-y}N$ $(0 \leq x \leq 1, 0 \leq y \leq 1, 0 \leq x+y \leq 1))$ has been expected to be applied to a light emitter having a wavelength range between green and ultraviolet, and in particular, to a semiconductor laser having the above wavelength range.

However, there is recently no substrate which suitably matches in lattice with the GaN. Therefore, a GaN thick film is deposited on the other preliminary substrate within the range between several tens µm and several hundreds µm. Thus-formed GaN thick film itself is attempted to be usable as a real substrate for growing a crystal of the above GaN base compound semiconductor.

Conventionally, the above GaN thick film has been generally formed by the use of the crystal growth method using a sapphire substrate as the preliminary substrate (K. Naniwae et al.: J. Crystal Growth 99 (1990) 381, W. Gotz et al.,: Appl. Phys. Lett. 69 (1996) 242).

However, the sapphire substrate generally has a large hardness. Consequently, it is extremely difficult to polish it. Further, there is also no etching liquid enough to achieve a rapid etching rate. In consequence, after the GaN thick film is formed on the sapphire substrate, it is excessively difficult to remove the sapphire substrate from the GaN thick film in the conventional crystal growth method.

Further, a crack is generated in the GaN thick film due to the difference of the coefficient of thermal expansion and the difference of the lattice constant between the sapphire and the GaN in the conventional crystal growth method. This is mainly because the sapphire has a large hardness.

On the other hand, a semiconductor laser which is formed by a plurality of GaN based compound semiconductor layers is structured by using a quartz substrate instead of the above sapphire substrate in Japanese Unexamined Patent Publication No. Hei. 8-83928 (thereinafter, referred to as a conventional reference). In this event, although the quartz has a low hardness, the GaN based compound semiconductor is inevitably formed by a thin film. Further, crystallinity, such as, a through dislocation density, of the grown GaN based compound semiconductor layer is degraded.

Consequently, the crack brings about in the GaN based compound semiconductor layer. Moreover, cleavage planes does not match between the quartz substrate and the GaN base compound semiconductor layer. As a result, a resonator mirror surface of the laser can not be formed by the use of the cleavage of the substrate. Therefore, the mirror surface must be formed by the use of a complicated process, such as, the known dry-etching process. Further, the mirror surface has a degraded flatness.

SUMMARY OF THE INVENTION

It is therefore an object of this invention to provide a method of manufacturing a semiconductor device which has no crack in a GaN thick film.

It is another object of this invention to provide a method of manufacturing a semiconductor device which is capable of readily removing a preliminary substrate after forming a GaN thick film.

It is still another object of this invention to provide a method of a semiconductor device which is capable of growing a GaN thick film which is advantageous in a device structure, such as, a semiconductor laser and a light emitting diode.

According to this invention, a quartz substrate is preliminarily prepared. In this event, the quartz substrate has a z-cut plane on a surface thereof Subsequently, a GaN film (namely, a GaN thick film) is deposited on the surface of the quartz substrate. Finally, the quartz substrate is removed from the GaN film.

More specifically, the quartz substrate has a trigonal crystal structure, and the z-cut plane is specified by (0001) plane of the crystal structure.

In this event, an angle between the surface of the quartz substrate and the z-cut plane falls within the range of 10° or less. The above z-cut plane is used for the deposition of the GaN film in order to improve crystallinity of the GaN film.

Further the removed GaN film is used as a real substrate for forming GaN based compound semiconductor layers thereon. This GaN based compound semiconductor layers are deposited on the GaN film so as to operable as a semiconductor laser.

In this event, the quartz substrate is readily polished and etched by the use of hydrofluoric acid because the quartz has a low hardness. In consequence, after the GaN film is formed on the quartz substrate, the quartz substrate is easily removed by the etching process or the polishing process.

In this case, the removed GaN film is effectively used as the real substrate for the nitride based compound semiconductor device. Namely, a plurality of nitride base compound semiconductor layers are deposited on the GaN film as the real substrate to form the semiconductor laser structure.

Consequently, the cleavage plane between the quartz substrate and the nitride base compound semiconductor layer is coincident to each other. Thereby, the resonator mirror surface of the laser device can be formed by the use of the cleavage of the substrate without the complicated process such as the dry-etching process. Further, the cleavage plane can have an excellent flatness because the complicated dry-etching process is not used in this invention.

DESCRIPTION OF THE PREFERRED EMBODIMENTS

Figure 1:
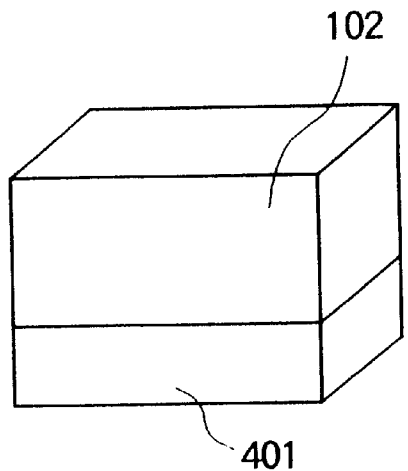
FIG. 1 is a schematic view showing a conventional method of manufacturing a semiconductor device having a GaN thick film.

Referring to FIG. 1, a conventional method of manufacturing a semiconductor device will be first described for a better understanding of this invention. The manufacturing method is equivalent to the conventional manufacturing method using a sapphire substrate mentioned in the preamble of the instant specification.

As mentioned before, a GaN thick film is generally formed by the use of the crystal growth method using a sapphire substrate as a preliminary substrate.

As illustrated in FIG. 1, the GaN thick film 102 is deposited on the sapphire substrate 401 to a thickness of 100 $\mu$m. Thereafter, the sapphire substrate 401 is removed or separated from the GaN thick film 102. This removed GaN thick film 102 is used as a real substrate for depositing the GaN base compound semiconductor layers thereon. Herein, it is to be noted that the sapphire substrate has a (0001) plane on a surface thereof.

Under such a circumstance, after the GaN thick film 102 is formed on the sapphire substrate 401, it is difficult to remove the sapphire substrate 401 from the GaN thick film 102 in the conventional crystal growth method. This is because the sapphire substrate 401 generally has a large hardness and it is extremely difficult to polish it.

Further, the crack inevitably takes place in the GaN thick film 102 because the coefficient of thermal expansion and the lattice constant are different between the sapphire substrate 401 and the GaN thick film 102. This results in a large hardness of the sapphire substrate 401.

Taking the above-mentioned problem into consideration, this invention provides the method of manufacturing the semiconductor device which has the GaN thick film without any crack therein.

Subsequently, description will be made about a method of manufacturing semiconductor devices according to embodiments of this invention with reference to FIGS. 2 through 4.

First Embodiment

Description will be made about a first embodiment of this invention with reference to FIG. 2.

Figure 2:
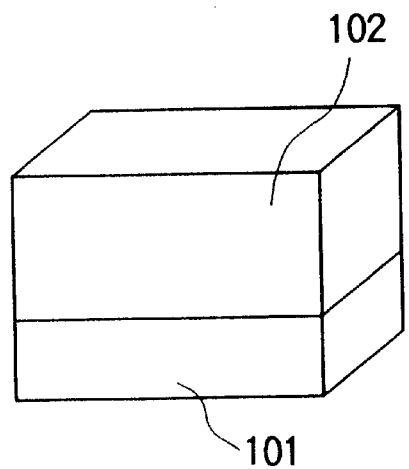
FIG. 2 is a schematic view showing a method of manufacturing a semiconductor device having a GaN thick film according to a first embodiment of this invention.

As illustrated in FIG. 2, a GaN thick film 102 is deposited on a quartz substrate 101 to a thickness of 100 $\mu$m. Herein, it is to be noted that the quartz substrate has a z-cut plane (namely, (0001) plane) on the surface.

In this case, the GaN thick film 102 is grown by the use of the known hydride vapor phase growth method. Specifically, the quartz substrate 101 and a Ga raw material portion (not shown) are retained at temperatures of 950° C. and 850° C. in the known hydride vapor phase growth apparatus respectively. In this event, an $N_2$ gas flows under a flowing rate of 6 liters/min. Further, an HCl gas which is diluted with the $N_2$ gas flows from an upper stream of the Ga raw material portion. Subsequently, a GaCl gas which is a reaction product between the Ga raw material and the HCl gas is transferred to a substrate portion.

Under this condition, an $NH_3$ gas flows immediately close to the substrate by bypassing the Ga raw material portion. Thereby, the $NH_3$ gas reacts with the GaCl gas so that the GaN thick film 102 is deposited to the thickness of 100 $\mu$m. In this event, the flow rates of the HCl gas and $NH_3$ gas are selected to 50 cc/min and 250 c/min, respectively.

In this first embodiment, the hydride vapor phase growth method is used as the crystal growth method for forming the GaN thick film 102 on the quartz substrate 101. Thereby, the GaN thick film 102 is formed at a rapid growth rate. Consequently, it is possible that the GaN thick film 102 is deposited at a short time.

Further, the crystallinity of the GaN thick film 102 is largely improved by the use of the quartz substrate 101 having the z-cut plane on the surface, as compared to the case that the quartz substrate has the other crystal plane on the surface. This reason will be explained in detail as follows.

Namely, the (0001) plane of a hexagonal GaN is extremely stable. Therefore, when a layer having the (0001) plane on the surface is grown in the crystal growth of the hexagonal GaN, a three dimensional growth is restricted or suppressed. Consequently, it is desirable that the substrate surface has a symmetrical plane similar to the (0001) plane for the crystal growth of the GaN.

In the meanwhile, although the sapphire has a trigonal crystal structure, the sapphire substrate having the (0001) plane on the surface has been conventionally used in the crystal growth method of the GaN thick film from the above-mentioned reason.

From the same reason, it is preferable that the quartz substrate having the (0001) plane (namely, the z-cut plane) on the surface is used in the crystal growth of the GaN like the sapphire substrate because the quartz also has the trigonal crystal structure.

In contrast, if the GaN thick film is formed by using the quartz substrate having a plane other than the z-cut plane by the use of the crystal growth, a layer having a plane other than the (0001) plane is inevitably formed on the surface of the quartz substrate. Consequently, the three-dimensional growth readily occurs. As a result, it is difficult to obtain the mirror surface.

Herein, it is unnecessary that the surface of the quartz substrate 101 strictly has the z-cut plane. If an angle between the surface of the quartz substrate 101 and the z-cut plane falls within the range of 10° or less, no problem is caused to occur.

Second Embodiment

Description will be made about a second embodiment of this invention with reference to FIG. 3.

Figure 3:
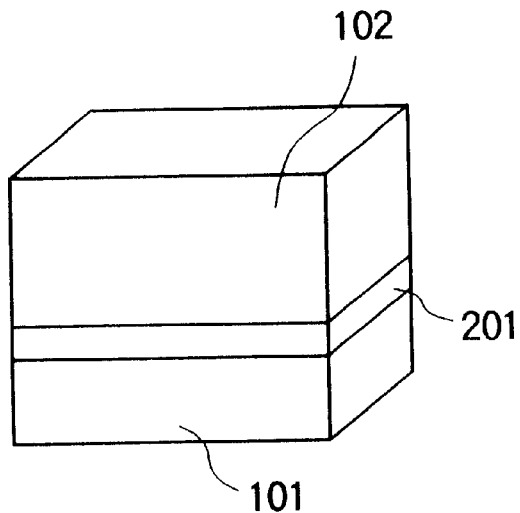
FIG. 3 is a schematic view showing a method of manufacturing a semiconductor device having a GaN thick film according to a second embodiment of this invention.

As illustrated in FIG. 3, a GaN buffer layer 201 is deposited on a quartz substrate 101 to a thickness of 500 Å. Further, a GaN thick film 102 is deposited on the GaN buffer layer 202 to the thickness of 100 $\mu$m.

In this event, the GaN buffer layer 201 is formed by the use of the low temperature growth method under a substrate temperature of 485° C. by the known hydride vapor growth method. In this event, the GaN buffer layer 201 may be called a low temperature growth buffer layer.

Likewise, the GaN thick film 102 is also formed by the use of the known hydride vapor growth method. Herein, it is to be noted that the quartz substrate 101 has the z-cut plane (namely, (0001) plane) on the surface.

In the second embodiment, the GaN buffer layer 201 is placed between the quartz substrate 101 and the GaN thick film 102, as illustrated in FIG. 3. Consequently, the difference of the lattice constant between the quartz substrate 101 and the GaN thick film 102 is reduced or eliminated. As a result, the crystalinity of the GaN thick film 102 is further improved as compared to the first embodiment.

In this second embodiment, the hydride vapor phase growth method is also used as the crystal growth method for forming the GaN thick film 102 like the first embodiment. Thereby, the GaN thick film 102 is formed at the rapid growth rate. Consequently, it is possible that the GaN thick film 102 is deposited at a short time.

Further, the quartz substrate 101 having the z-cut plane on the surface is also used in the second embodiment. In consequence, the crystallinity of the GaN thick film 102 is improved as compared to the case that the quartz substrate having the other substrate plane on the surface is used, as mentioned above.

Herein, it is unnecessary that the surface of the quartz substrate strictly has the z-cut plane. If an angle between the surface of the quartz substrate 101 and the z-cut plane falls within the range of 10° or less, no problem is caused to occur like the first embodiment.

In the meanwhile, it is to be noted that a layer which is represented by the general formula $(In_xGa_{1-x}N\ (0 \leq x \leq 1))$ and which is formed within the range of the substrate temperature between 400° C. and 700° C. may be used instead of the GaN buffer layer 201 which is deposited at the substrate temperature of 485° C.

Third Embodiment

Description will be made about a third embodiment of this invention with reference to FIG. 4.

Figure 4:
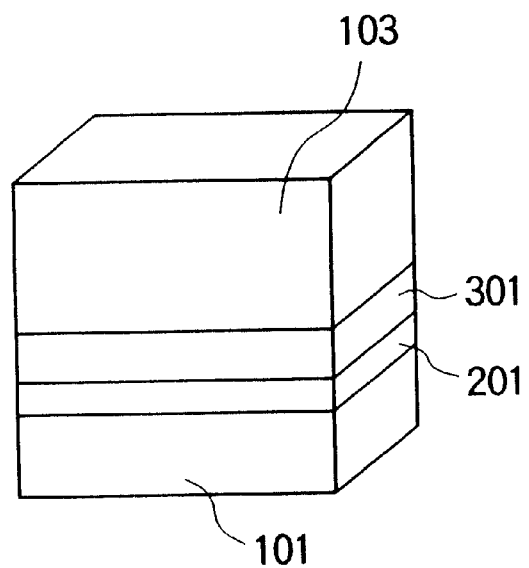
FIG. 4 is a schematic view showing a method of manufacturing a semiconductor device having a GaN thick film according to a third embodiment of this invention.

As illustrated in FIG. 4, a first GaN buffer layer 201 is deposited on a quartz substrate 101 having the z-cut plane on the surface to a thickness of 200 Å by the use of the known MOCVD (metal organic chemical vapor deposition) method. In this event, the first GaN buffer layer 201 is formed by the low temperature growth method under the substrate temperature of 450° C. Therefore, the first GaN buffer layer may be called a low temperature growth buffer layer.

Thereafter, a second GaN buffer layer 301 is deposited on the first GaN buffer layer 201 to the thickness of 1.5 $\mu$m by the use of the MOCVD method. In this event, the second GaN buffer layer 301 is formed by the use of the known high temperature epitaxial growth method under the substrate temperature of 1050° C. Herein, it is to be noted that the second GaN buffer layer 301 may be called a high temperature epitaxial growth layer.

Successively, a GaN thick film 102 is deposited on the second buffer layer 301 to the thickness of 100 $\mu$m by the use of the hydride vapor growth method.

In the third embodiment, both first and second buffer layers are formed by the use of the MOCVD method, as mentioned before. In this case, the epitaxial growth layer having an excellent crystalinity can be formed over the quartz substrate 101 by the use of the MOCVD method. In consequence, the crystalinity of the GaN thick film 102 is further improved as compared to the first and second embodiments illustrated on FIGS. 2 and 3.

In this third embodiment, the hydride vapor phase growth method is also used as the crystal growth method for forming the GaN thick film 102 like the first and second embodiments. Thereby, the GaN thick film 102 is formed at the rapid growth rate. Consequently, it is possible that the GaN thick film 102 is deposited at the short time.

Further, the quartz substrate 101 having the z-cut plane on the surface is also used in the third embodiment. In consequence, the crystallinity of the GaN thick film 102 is improved as compared to the case that the quartz substrate having the other substrate plane on the surface is used, like the first and second embodiments.

Herein, it is unnecessary that the surface of the quartz substrate strictly has the z-cut plane. If an angle between the surface of the quartz substrate and the z-cut plane falls within the range of 10° or less, no problem is caused to occur, like the first and second embodiments.

Herein, it is to be noted that a method of forming the first and second buffer layers 201 and 301 on the quartz substrate 101 is not limited to the MOCVD method in the third embodiment, and the known MBE (molecular beam epitaxial growth) method may be used instead of the MOCVD method. In this event, the same effect can be realized by the use of the MBE method.

In the mean while, a single layer or a multi-layer which are represented by the general formula $(In_xAl_yGa_{1-x-y}N\ (0 \leq x \leq 1, 0 \leq y \leq 1, 0 \leq x+y \leq 1))$ may be used instead of the first and second buffer layers 201 and 301 illustrated in FIG. 4 by the use of the MOCVD method or the MBE method.

As mentioned before, although the thickness of the GaN thick film 102 is selected to 100 $\mu$m in the first through third embodiments, the thickness is not limited to the above value. For instance, 50 $\mu$m or 200 $\mu$m may be adopted as the film thickness.

Namely, it is required that the GaN thick film 102 has the thickness of 10 $\mu$m or more in order to be acceptable as the thick film of the real substrate. If the GaN thick film 102 has thickness of 10 $\mu$m or more, the crack which is caused by the difference of the coefficient of thermal expansion and the lattice constant between the quartz and the GaN is not generated in the GaN thick film 102.

What is claimed is:

1. A method of manufacturing a semiconductor device, comprising the steps of:

preparing a quartz substrate which has a z-cut plane on a surface thereof;

depositing a GaN film on the surface; and removing said quartz substrate from said GaN film.

2. A method as claimed in claim 1, wherein:

said quartz substrate has a trigonal crystal structure, and the z-cut plane is specified by (0001) plane of the crystal structure.

3. A method as claimed in claim 1, wherein:

an angle between the surface and the z-cut plane falls within the range of 10° or less.

4. A method as claimed in claim 1, wherein:

the z-cut plane is used in order to improve crystallinity of said GaN film.

5. A method as claimed in claim 4, wherein:

said GaN film contains no crack.

6. A method as claimed in claim 5, wherein:

said GaN film has a film thickness of 10 $\mu$m or more.

7. A method as claimed in claim 1, wherein:

said GaN film is deposited by the use of the hydride vapor phase growth.

8. A method as claimed in claim 7, wherein:

the hydride vapor phase growth is used in order to deposit said GaN film at a rapid growth rate.

9. A method as claimed in claim 1, wherein:

the removal of said quartz substrate is carried out by the use of an etching process.

10. A method as claimed in claim 1, wherein:

the removal of said quartz substrate is carried out by the use of a polishing process.

11. A method as claimed in claim 1, wherein:

said removed GaN film is used as a real substrate for forming GaN based compound semiconductor layers thereon.

12. A method as claimed in claim 1, wherein:

said GaN based compound semiconductor layers are deposited on said GaN film so as to operable as a semiconductor laser.

13. A method of manufacturing a semiconductor device, comprising the steps of:

preparing a quartz substrate which has a z-cut plane on a surface thereof;

forming a buffer layer on the surface;

depositing a GaN film on said buffer layer; and removing said quartz substrate from said buffer layer.

14. A method as claimed in claim 13, wherein:
said buffer layer comprises a GaN layer which is formed by the use of the low temperature growth.

15. A method as claimed in claim 13, wherein:
said buffer layer comprises a layer which is represented by the general formula ($In_xGa_{1-x}N$ ($0 \leq x \leq 1$)).

16. A method as claimed in claim 15, wherein:
said $In_xGa_{1-x}N$ layer is formed within the range of a substrate temperature between 400° C. and 700° C.

17. A method as claimed in claim 13, wherein:
said buffer layer is formed in order to reduce difference of lattice constant between said quartz substrate and said GaN film.

18. A method of manufacturing a semiconductor device, comprising the steps of:
preparing a quartz substrate which has a z-cut plane on a surface thereof;
forming a first buffer layer on the surface;
forming a second buffer layer on said first buffer layer;
depositing a GaN film on said second buffer layer; and
removing said quartz substrate from said first buffer layer.

19. A method as claimed in claim 18, wherein:
said first buffer layer comprises a first GaN layer which is formed by the low temperature growth.

20. A method as claimed in claim 18, wherein:
said second buffer layer comprises a second GaN layer which is formed by the high temperature epitaxial growth.

21. A method claimed in claim 19, wherein:
each of said first and second buffer layers is formed by the use of the metal organic chemical vapor deposition.

22. A method claimed in claim 19, wherein:
each of said first and second buffer layers is formed by the use of the molecular beam epitaxial growth.

23. A method claimed in claim 18, wherein:
each of said first and second buffer layers comprises a single layer or a multi-layer which are represented by the general formula ($In_xAl_yGa_{1-x-y}N$ ($0 \leq x \leq 1$, $0 \leq y \leq 1$, $0 \leq x+y \leq 1$).

24. A method claimed in claim 20, wherein:
each of said first and second buffer layers is formed by the use of the metal organic chemical vapor deposition.

25. A method claimed in claim 20, wherein:
each of said first and second buffer layers is formed by the use of the molecular beam expitaxial growth.

* * * * *